United States Patent
Nagarajan et al.

(10) Patent No.: US 8,999,431 B2
(45) Date of Patent: Apr. 7, 2015

(54) CONDUCTIVE FORMULATIONS FOR USE IN ELECTRICAL, ELECTRONIC AND RF APPLICATIONS

(75) Inventors: Ramaswamy Nagarajan, Dracut, MA (US); Sharavanan Balasubramaniam, Blacksburg, VA (US); Julie Chen, Wilmington, MA (US); Joey Mead, Carlisle, MA (US)

(73) Assignee: University of Massachusetts Lowell, Lowell, MA (US)

( * ) Notice: Subject to any disclaimer, the term of this patent is extended or adjusted under 35 U.S.C. 154(b) by 967 days.

(21) Appl. No.: 12/628,566

(22) Filed: Dec. 1, 2009

(65) Prior Publication Data
US 2012/0273263 A1 Nov. 1, 2012

Related U.S. Application Data

(60) Provisional application No. 61/200,542, filed on Dec. 1, 2008.

(51) Int. Cl.
*B05D 5/12* (2006.01)
*H05K 1/09* (2006.01)
*H05K 3/10* (2006.01)

(52) U.S. Cl.
CPC .............. *H05K 1/097* (2013.01); *H05K 3/105* (2013.01); *H05K 2201/0245* (2013.01); *H05K 2201/10151* (2013.01); *H05K 2203/121* (2013.01)

(58) Field of Classification Search
USPC ........................................................ 427/96.1
See application file for complete search history.

(56) References Cited

U.S. PATENT DOCUMENTS

| | | | |
|---|---|---|---|
| 3,962,143 | A | 6/1976 | Hitch et al. |
| 4,328,441 | A | 5/1982 | Kroeger, Jr. et al. |
| 4,369,269 | A | 1/1983 | Harper et al. |
| 4,402,338 | A | 9/1983 | Moller |
| 5,389,403 | A | 2/1995 | Buckley et al. |

(Continued)

FOREIGN PATENT DOCUMENTS

| | | |
|---|---|---|
| GB | 2 374 424 | 10/2002 |
| JP | 02297993 | 12/1990 |

(Continued)

OTHER PUBLICATIONS

PCT/US2009/066197: Notification Concerning Transmittal of International Preliminary Report on Patentability dated Jun. 16, 2011.

(Continued)

*Primary Examiner* — Austin Murata
(74) *Attorney, Agent, or Firm* — Hamilton, Brook, Smith & Reynolds, P.C.

(57) ABSTRACT

Metal flakes, an organic metal precursor, an organic solvent and either no binder, or a volatile or a thermally decomposable binder are combined to form a paste. The paste is deposited in a circuit pattern on a substrate and the circuit pattern is cured. While curing, the organic metal precursor decomposes to leave an electrically conductive path, and the printed circuit is thus formed. A precursor to an electrically conductive circuit material includes an organic metal precursor, metal microparticles, and an organic solvent. The method can be employed to form printed circuits, for a variety of electrical, electronic and sensing application, such as crack detection in ceramic, plastics, concrete, wood, fabric, leather, rubber or paper and composite materials.

17 Claims, 7 Drawing Sheets

(56) References Cited

U.S. PATENT DOCUMENTS

| | | | |
|---|---|---|---|
| 5,798,462 | A | 8/1998 | Briefer et al. |
| 6,025,725 | A | 2/2000 | Gershenfeld et al. |
| 6,036,889 | A | 3/2000 | Kydd |
| 6,151,967 | A | 11/2000 | McIntosh et al. |
| 6,278,379 | B1 | 8/2001 | Allen et al. |
| 6,973,838 | B2 | 12/2005 | Denis |
| 7,435,361 | B2 | 10/2008 | Carroll et al. |
| 7,498,802 | B2 | 3/2009 | Takahata |
| 8,026,729 | B2 | 9/2011 | Kroh et al. |
| 2003/0148024 | A1* | 8/2003 | Kodas et al. .............. 427/125 |
| 2004/0176623 | A1* | 9/2004 | Son et al. .................. 556/42 |
| 2005/0119752 | A1 | 6/2005 | Williams et al. |
| 2005/0207930 | A1 | 9/2005 | Yamaguchi |
| 2005/0223812 | A1 | 10/2005 | Denis |
| 2005/0227820 | A1 | 10/2005 | Dyer et al. |
| 2006/0261316 | A1 | 11/2006 | Jun et al. |
| 2007/0074579 | A1 | 4/2007 | Cook et al. |
| 2008/0218416 | A1* | 9/2008 | Handy et al. ............ 343/700 MS |
| 2009/0201043 | A1* | 8/2009 | Kaltalioglu ............... 324/765 |
| 2009/0278553 | A1 | 11/2009 | Kroh et al. |
| 2010/0189901 | A1* | 7/2010 | Chung et al. .............. 427/256 |
| 2011/0029084 | A1 | 2/2011 | Milbocker et al. |
| 2012/0130687 | A1 | 5/2012 | Otto et al. |
| 2012/0146671 | A1 | 6/2012 | Furuta et al. |
| 2012/0297888 | A1 | 11/2012 | Nagarajan et al. |

FOREIGN PATENT DOCUMENTS

| | | | |
|---|---|---|---|
| JP | 10074860 | | 3/1998 |
| WO | WO 02/097374 | | 12/2002 |
| WO | WO 2008/018718 | * | 2/2008 |
| WO | WO 2009/146089 | | 12/2009 |
| WO | WO 2010/065503 | | 6/2010 |
| WO | WO 2011/066028 | | 6/2011 |

OTHER PUBLICATIONS

PCT/US2009/066197: Notification of Transmittal of the International Search Report and the Written Opinion of the International Searching Authority, or the Declaration dated Jun. 24, 2010.

PCT/US2009/066197: International Search Report dated Jun. 24, 2010.

PCT/US2009/066197: Written Opinion of the International Search Authority dated Jun. 24, 2010.

Buffat, P. And Borel, J.P., "Size Effect on the Melting Temperature of Gold Particles," *Phys. Rev. A.*, 13 (6): 2287-2298 (1975).

Nakamoto, M., et al. "A Variety of Silver Nanoparticle Pastes for Fine Electronic Circuit Pattern Formation," *IEEE Polytronic 2007 Conference*: 105-109 (2007).

Kashiwagi, Y., et al. "Facile Size-Regulated Synthesis of Silver Nanoparticles by Controlled Theintolysis of Silver Alkylcarboxylates in the Presence of Alkylamines with Different Chain Lengths", *J. Colloid & Interface Sci.*, 300(1): 169-175 (2006).

Teng, K.F. and Vest, R.W., "Liquid Ink Jet Printing with MOD Inks for Hybrid Microcircuits," *IEEE Trans. Components, Hybrids & Manufacturing Tech.* 12(4):545-549 (1987).

Dearden, A.L., et al. "A Low Curing Temperature Silver Ink for Use in Ink-Jet Printing and Subsequent Production of Conductive Tracks," *Macromol. Rapid Commun.* 26: 315-318 (2005).

Curtis, C.J., et al., "Direct-Write Printing of Silver Metallizations on Silicon Solar Cells," *Mat. Res. Soc. Symp. Proc.* 730: 79-84 (2002).

Lu, Chun-An et al., "Characterization of the Low-Curing-Temperature Silver Paste Containing Silver 2-Ethylhexanoate Addition" *Japanesel of App. Phys.* 46(1): 251-255 (2007).

Office Action, U.S. Appl. No. 13/394,490, dated Aug. 15, 2014, "Wireless Passive Radio-Frequency Strain and Displacement Sensors".

PCT/US2010/047977: International Search Report and Written Opinion of the International Search Authority, "Wireless Passive Radio-Frequency Strain and Displacement Sensors," dated Aug. 9, 2011.

PCT/US2010/047977: International Preliminary Report on Patentability, "Wireless Passive Radio-Frequency Strain and Displacement Sensors," dated Mar. 13, 2012.

\* cited by examiner

Optical micrograph
of 200 micron wide crack

FIG. 10B

CONDUCTIVE FORMULATIONS FOR USE IN ELECTRICAL, ELECTRONIC AND RF APPLICATIONS

RELATED APPLICATION

This application claims the benefit of U.S. Provisional Application No. 61/200,542, filed on Dec. 1, 2008. The entire teachings of the above application are incorporated herein by reference.

GOVERNMENT SUPPORT

The invention was supported, in whole or in part, by Award Number: W911NF-07-2-0081 from United States Army Research Labs. The United States Government has certain rights in the invention.

FIELD OF THE INVENTION

The present invention relates to metallic conductive ink compositions based on a volatile and/or decomposable binder that can be printed and cured at low temperatures (less than 150° C.) on a substrate of interest to yield highly conductive metallic patterns.

BACKGROUND OF THE INVENTION

Electrically-conductive ink formulations that can be thermally converted into metallic patterns forming electrical interconnects, components or wireless sensors have been previously described in patent literature and are commercially available. However, these formulations are often composed of metal particles (flakes/nanopowders), organic metal precursors, binders, additives and solvents. The presence of resinous binders and other additives in the conductive formulations increase the resistance and interferes with the RF/(Radio Frequency)/AC (alternating current) characteristics of the printed elements and typically require curing at high temperature in order to achieve sufficient conductivities. Therefore, formulations that include resinous binders and other additives often are not suitable for temperature-sensitive substrates like plastics or the RF (radio frequency)/AC (alternating current) applications. The utility of these commercial printable conductive formulations have been limited mainly to direct current applications (printed circuitry and interconnections for electronic devices). Further, conventional low-temperature electrically conductive adhesives (ECAs) have limitations such as relatively low electrical conductivity and unstable contact resistance.

The use of inductively-coupled passive radio frequency sensors previously has been described in the area of structural health monitory (crack detection). For example, U.S. Pat. No. 6,973,838, the entire contents of which are incorporated herein by reference, discloses a non-contact crack sensor to detect cracks in composite materials. However, the practical and cost-effective fabrication of these sensors has not been described in any patent or relevant sensor literature. Sensors for wireless structural health monitoring typically are fabricated by photolithography and laser micromachining techniques that are cumbersome or expensive.

There is a need for electrically conductive formulations that overcome or minimize the above-referenced problems.

SUMMARY OF THE INVENTION

In one aspect, the present invention is directed to a method for fabricating a printed circuit suitable for a variety of electrical, electronic and sensing applications. The method includes combining metal flakes, an organic metal precursor, an organic solvent and either no binder, or a volatile or a thermally decomposable binder, to form a paste. The paste is deposited in the form of a three dimensional pattern on a substrate of interest and transformed into metallic patterns (circuits) by heat treatment (curing). While curing, the organic metal precursor decomposes to leave an electrically conductive path, and the printed circuit is thus formed.

In another aspect, the present invention is directed to a printed circuit formed by combining metal flakes, an organic metal precursor, an organic solvent and either no binder, or a volatile or a thermally decomposable binder, to form a paste. The paste is deposited in a circuit pattern on a substrate and the circuit pattern is cured. While curing, the organic metal precursor decomposes to leave an electrically conductive path, and the printed circuit is thus formed.

In yet another aspect, the present invention is directed to a precursor to an electrically conductive circuit material. The precursor includes an organic metal precursor, metal microparticles, and an organic solvent.

In another aspect, the present invention is directed to a printed crack sensor fabricated by combining metal flakes, an organic metal precursor, an organic solvent and either no binder, or a volatile or a thermally decomposable binder. The paste is deposited in an electrically conductive pattern on a substrate of the interest. The formation of a crack on the surface causes disruption of the conductive pattern resulting in the change of electrical resistance, capacitance or inductance or any combination thereof. The sensor can either be interrogated by directly measuring the DC resistance or by wirelessly monitoring the inductance, capacitance and combinations thereof of the sensor/electrical element at or near resonance in the far field.

When the sensor is energized remotely using an alternating electric field, a magnetic flux is created around the sensor according to Ampere's law. The radiated magnetic field from the interrogation unit induces an electromotive force (emf) in the sensor. The resonant frequency of the LC circuit (sensor) is monitored by recording the return loss spectrum or the reflection loss spectrum. Return loss, or the magnitude of the reflection coefficient, is expressed as a ratio in decibels (dB) relative to the transmitted signal power. For the series LC circuit (printed sensor), both the induced emf and the back emf across the interrogator reach a maximum at resonance. As a result, a sharp resonant dip is seen at the resonant frequency of the LC circuit sensor.

The electrically conductive formulations of the invention cure at relatively low temperature into a continuous, conductive pattern so as to be capable of printing onto a plastic substrate and to enable deposition techniques that can yield continuous metallic traces. Using formulations according to the present invention, highly conductive sensing elements can be printed using traditional printing technologies like screen-printing. This enables roll-to-roll manufacture of flexible electronic elements. The absence of binders substantially reduces cure temperatures and makes the process suitable for temperature-sensitive substrates like plastics. Binder-less compositions enable formation of printed circuits with lower resistance and render them more suitable for RF applications. The ink formulations and the procedures of the invention can be applied broadly to the fabrication of electrical/electronic/sensing elements in the areas of Conformal/Flexible Printed Electronics. Specific products include RFID antennae, wireless crack sensors, strain gauges, conductive elements in printed circuit boards. Wireless sensors of the invention can be employed to detect cracks in defense applications, such as cracks in ceramic body armor plates used by soldiers, and in civilian infrastructure, such as bridges and concealed tubes. These inks can also be used for fabrication of electrical connections/leads for solar cells, OLEDs, flexible displays and touch screens. The metallic ink formulations of this invention also can be printed to yield sensing elements like inductor-interdigital capacitor circuits. These electronic elements can be advantageously used for technologically important applications like structural health monitoring (wireless crack and strain sensing).

BRIEF DESCRIPTION OF THE FIGURES

The patent or application file contains at least one drawing executed in color. Copies of this patent or patent application publication with color drawings will be provided by the Office upon request and payment of the necessary fee.

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

While this invention has been particularly shown and described with references to example embodiments thereof, it will be understood by those skilled in the art that various changes in form and details may be made therein without departing from the scope of the invention encompassed by the appended claims.

In one embodiment, the invention is a method for fabricating a printed circuit. The method includes combining metal flakes, and organic metal precursor, an organic solvent and either no-binder, or a volatile or thermally decomposable binder, to form a paste. Examples of suitable metals include silver, copper, silver-coated copper, silver-coated nickel, aluminum, and other possible combinations of alloys thereof.

In one embodiment, the metal flakes have a major dimension in a range of less than about ten micrometers. In another embodiment, the metal flakes have a major dimension of less than about five micrometers. Metal flakes suitable for use in the method of the invention can be formed by techniques such as are known in the art, including, for example, milling of a metal powder with a suitable lubricant. In another embodiment, the metal flakes are in the form of nanoparticles, having a diameter in a range of between about twenty and about five hundred nanometers.

In one embodiment, the metal flakes are present in an amount in a range of between about 60% and 90% by weight of the paste. In another embodiment, the metal flakes are present in an amount in a range of between about 75% and about 80% by weight of the paste.

The organic metal precursor is an organic compound of the respective metal, where the metal atom is bonded to the organic moieties through a heteroatom like oxygen, nitrogen or sulfur. Examples of suitable organic precursors for use in forming the paste include at least one member selected from the group consisting of silver acrylate, silver 2,4 pentanedionate, silver neodecanoate and silver 2-ethylhexanoate. Typically, the precursor is present in the paste in an amount in a range of between about 5% and about 30%. In another embodiment, the precursor is present in the paste in an amount in a range of between about 5% and 10% by weight.

Figure 1:
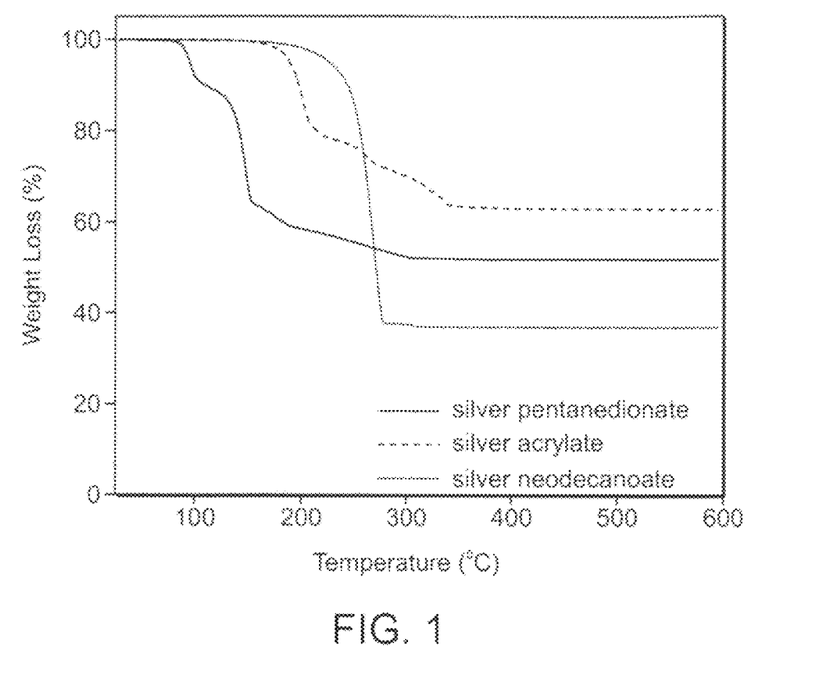
FIG. 1 is a graph depicting thermogravimetric curves of some organic silver precursors.

Typically, the linkage between the metal and the organic groups is weaker than the bonds holding the organic groups together. The precursor can thermally decompose at relatively low temperatures to yield the metal. FIG. 1 shows thermogravimetric curves of some commercially available organic silver precursors. All the compounds shown decompose to pure silver in the temperature range 250-350° C. The composition of the metal flakes can typically be in the range of 4 to 20 times the weight of the organic metal precursor.

The major weight loss obtained from the derivative curves are shown in Table 1 and drive the choice of a suitable metal precursor for the present invention.

TABLE 1

Weight Loss of Selected Organic Metal Precursors

| Organic Metal Precursor | Temperature of Maximum Weight Loss |
|---|---|
| Silver 2,4-pentanedionate | 145° C. |
| Silver acrylate | 200° C. |
| Silver neodecanoate | 265° C. |

The organic solvent in one embodiment is at least one low-vapour pressure solvent selected from the group consisting of ethyl lactate, butyl acetate, propylene glycol monoethyl ether acetate, and 2-butoxyethyl acetate. Other suitable organic solvents include, for example, alpha terpineol, butyl carbitol acetate and carbonate. A "low vapour pressure solvent" as defined herein is a solvent having a vapor pressure lower than 20 mm mercury at 20 degrees Celsius.

As indicated above, inclusion of a binder to form the paste is optional. However, where employed, a binder can be, for example, a volatile or thermally-decomposable binder. Examples of suitable volatile binders include carbamate gels. Examples of suitable thermally-decomposable binders include but not limited to carbamate gel of N, N, N'-trimethyl ethylene diamine and carbamate gel of ethylene diamine In one embodiment, the binder, if present, is present in an amount in a range of between about 2% and about 10% by weight of the paste. In another embodiment, the binder is present in an amount in a range of between about 10% and 35% by weight of the paste. In another embodiment, the binder is present in an amount that substantially prevents the metal flakes of the paste from aggregating.

Figure 2A:
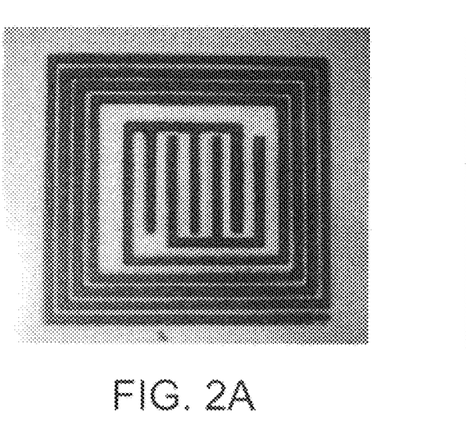
FIG. 2A depicts an inductor-interdigital capacitor (LC) sensing pattern of the invention printed on ceramic tile.
Figure 2B:
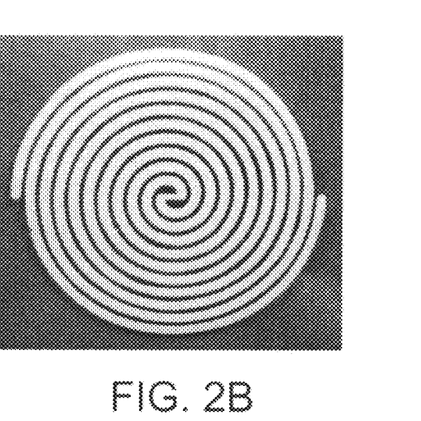
FIG. 2B depicts an inductor-interdigital capacitor (LC) sensing pattern of the invention printed on flexible polyester film.

The paste is deposited in a circuit pattern on a suitable substrate. Examples of suitable substrates include ceramic tile, flexible polyester film, ceramic, fiber reinforced composites/plastics, polymethylmethacrylate (PMMA) and polyethylene terephthalate (PET). Suitable methods for depositing the paste on to the substrate include screen printing, roto gravure printing, flexographic printing, direct-write technique (inkjet/pressure jet), single-roll coaters, two-roll s coaters, kiss coaters, squeeze roll coaters, inverted blade coaters, roll applicators, two blade coaters, air-knife coaters, knife-over-roll coaters, floating knife coaters, inverted knife coaters. The thickness of the coated pattern is designed to be higher than the skin depth of the electromagnetic field used for interrogation. For example, inductor-interdigital capacitor (LC) circuit elements can be screen-printed on plastic/ceramic substrates and cured at substrate-compatible temperatures to yield crack sensors. FIGS. 2A and 2B shows LC sensing patterns printed on a (A) ceramic tile and a (B) flexible polyester film.

The circuit pattern is then cured by a suitable method, such as would be known to one skilled in the art, whereby the organic metal precursor decomposes to leave an electrically conductive path, thereby forming the printed circuit board. In one embodiment, the circuit pattern is cured at a temperature less than about 250° C. In still another embodiment, the circuit pattern is cured at a temperature less than about 200° C. Alternatively, the circuit pattern is cured at a temperature less than about 150° C.

Figure 3:
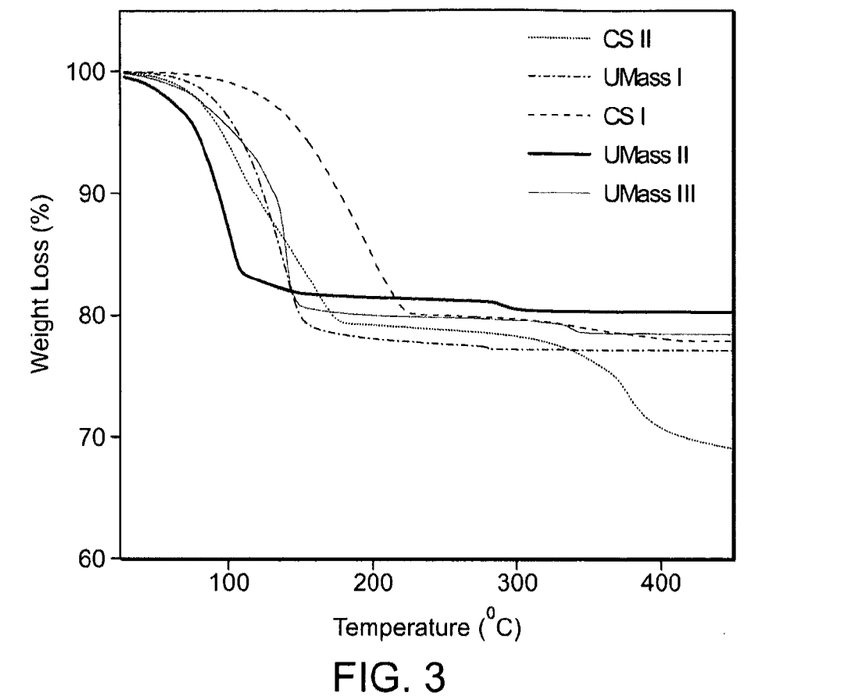
FIG. 3 depicts thermogravimetric curves of commercial conductive silver formulations and conductive silver formulations according to the present invention.

FIG. 3 shows the thermogravimetric curves of commercial conductive silver paste formulations and those of formulations according to the present invention. It can be seen that binder-free formulations described according to the present invention can be thermally converted to metallic silver at substantially lower temperatures (e.g., lower than 120° C.) than some commercially available samples (abbreviated as CS I and CS II in all the figures). "UMass I" is a silver ink with tarpineol as solvent. "UMass II" is a silver ink with 2-butoxyethanol as solvent and carbamate gel of N, N, N'-trimethyl ethylene diamine. "UMass III" is a silver ink with 2-butoxyethanol as solvent and carbamate gel of ethylene diamine. All of UMass I-III have 82% solids (silver flakes and silver acetylacetonate) mixed with solvent (solvent plus binder) or "CSI" is an ink called "PARAMOD" from a company called G&W RFID. "CSII" is a silver epoxy from Creative Materials, Inc.

Figure 4:
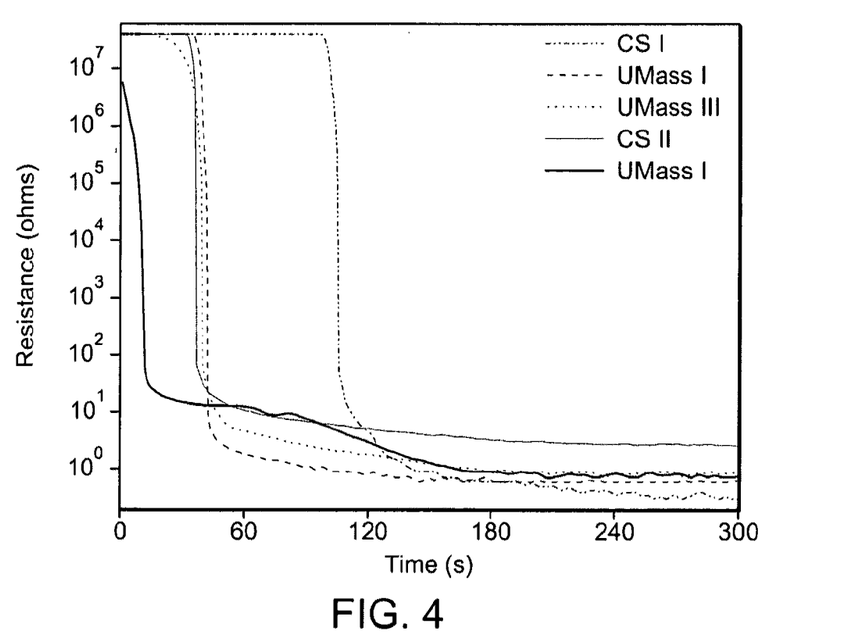
FIG. 4 depicts cure characteristics of commercial conductive silver formulations and conductive silver formulations according to the present invention.

The formulations according to the present invention exhibit a rapid drop in resistance (several orders of magnitude decrease) over short heating times (substantially lower exposure to heat) while curing to yield highly conductive elements. FIG. 4 shows a plot of the direct current (d.c.) resistance of printed line patterns as a function of cure time. The formulations described in the present invention show a substantial drop in resistance at cure times of less than a minute.

Figure 5A:
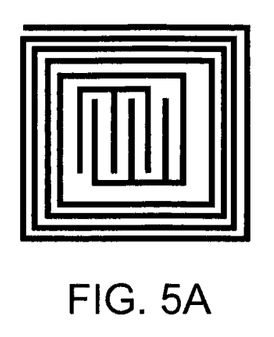
FIGS. 5A and 5B depict printed resonant inductor-interdigital capacitor (LC) circuit patterns of the invention for passive wireless sensing.
Figure 5B:
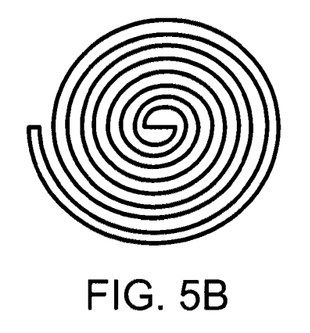

In another embodiment, the invention is a printed circuit formed by the method described above. By printing wireless sensing elements using conductive formulations according to the present invention a large variety of wireless sensors can be fabricated. Printed inductor-interdigital capacitor (LC) circuits, such as those shown in FIGS. 5A and 5B, enable passive, wireless sensing because of their resonant characteristics.

In still another embodiment, the invention is a precursor to an electrically conductive circuit material. The precursor includes an organic metal precursor, metal microparticles and an organic solvent, all of which are described above with respect to the method of the invention for fabricating the printed circuit.

In one specific embodiment, the invention includes a silver ink formulation containing several types of volatile binders that are substantially removed during drying/curing. The ink can be applied to plastic/ceramic substrates by screen-printing and the metal flakes are converted to metallic traces in a low-temperature thermal curing step. The goal is to print electrical elements that may include but are not limited to inductor-capacitor circuits, suitable for a variety of applications.

Figure 6:
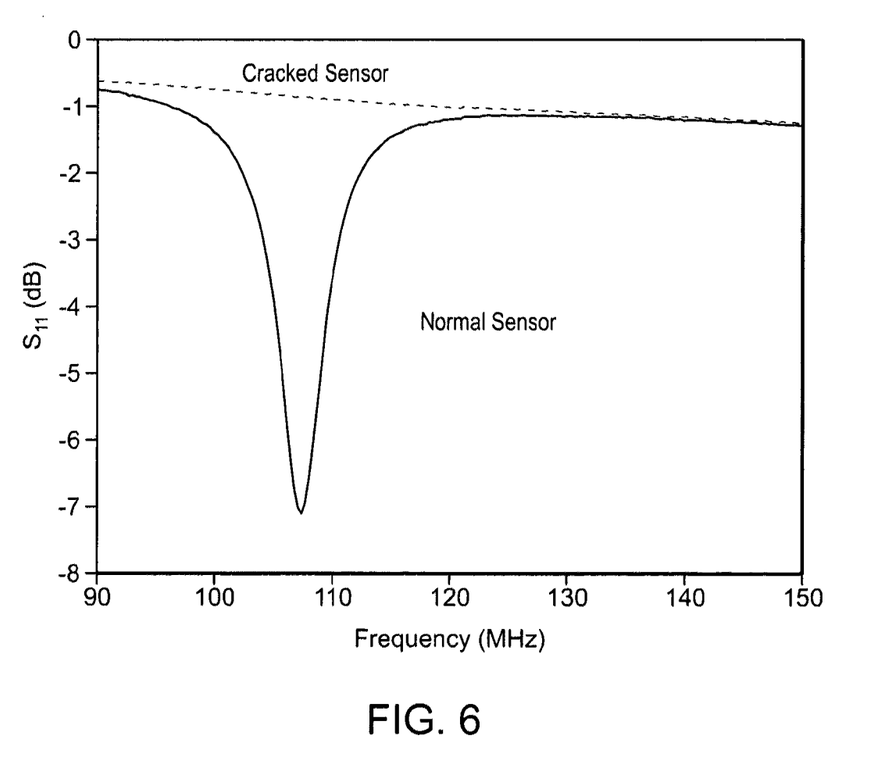
FIG. 6 depicts a resonance frequency response of a normal working sensor and a cracked sensor interrogated with a network analyzer.

In another specific embodiment, the conductive inks presented in the invention can be employed in applications such as detection of structural defects like cracks. Printed sensors show a characteristic resonant dip when wirelessly interrogated with a vector network analyzer in the frequency range of interest. When a crack is formed on the surface of the substrate, the crack causes disruption in the printed metallic pattern resulting in the change of the resonance frequency and loss of the resonance response in the frequency range in which the LC sensor was originally resonant. FIG. 6 compares the resonance frequencies of a circuit element having a cracked substrate versus that of a normal substrate. When a crack in the underlying substrate disrupts the sensing elements, the resonance disappears, leading to a flat response as shown in FIG. 6.

Figure 7:
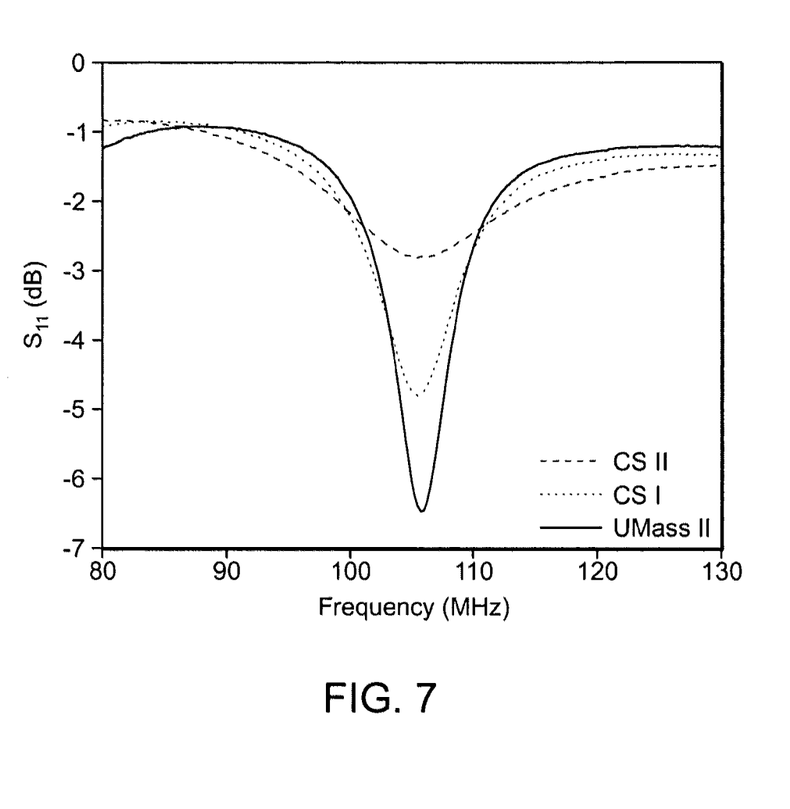
FIG. 7 depicts quality factors of RF response of printed inductor-interdigital capacitor (LC) sensors at resonance formed from commercial conductive silver formulations and a LC sensor printed using conductive silver formulation according to the present invention.

Formulations of the present invention provide for the fabrication of LC sensors with high quality factors. The quality factor of the sensors is inversely related to the resistance and square root of capacitance of the printed circuit lines. The binderless silver formulations described in the present invention typically have substantially higher quality than commercially available silver inks, as shown in FIG. 7.

Figure 8A:
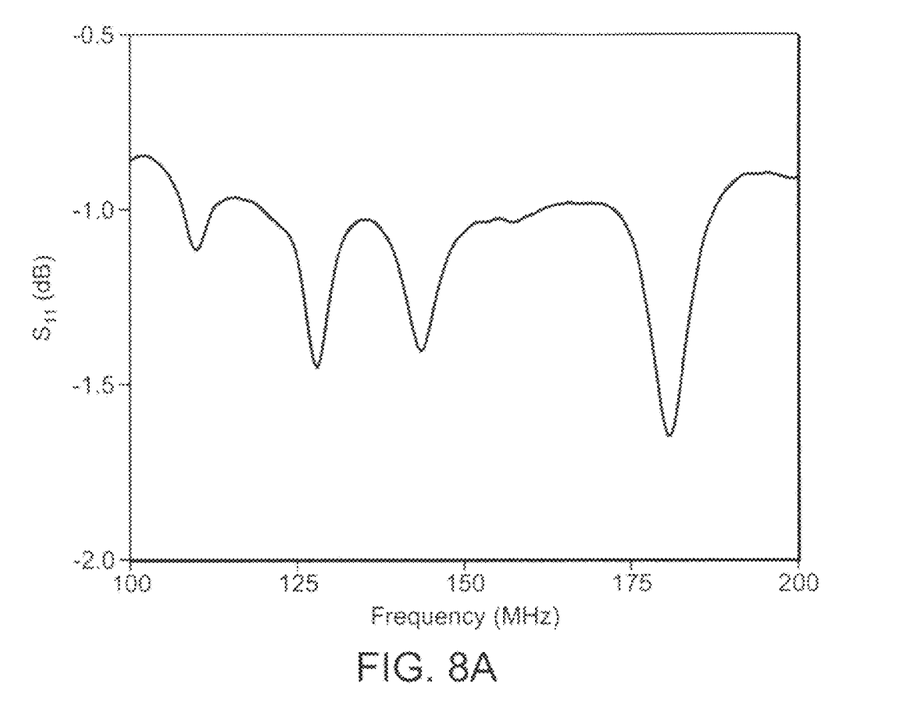
FIG. 8A depicts a resonance frequency response of four printed inductor-interdigital capacitor (LC) patterns interrogated simultaneously.
Figure 8B:
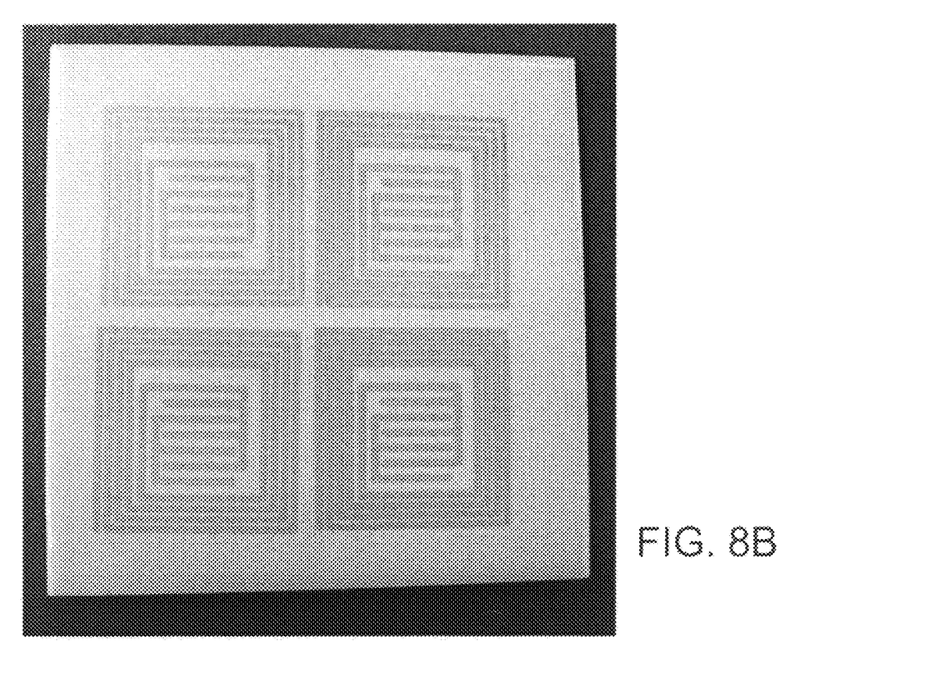
FIG. 8B is a photograph of the four sensors printed on a ceramic plate.

Formulations of the present invention provide for the detection of structural defects like cracks on structures with large surface areas. Multiple LC sensing elements with unique resonant frequencies can be printed on substrates with large areas. These sensors can be wirelessly interrogated simultaneously with a network analyzer as shown in FIG. 8. The presence of a crack in the substrate will lead to a loss of the resonant characteristics of the LC patterns in that area, enabling the detection and location of defects anywhere in the substrate. The number of sensors with unique resonant frequencies that would respond without interference/cross-talk and can be packed in a given area would depend on the quality factor of the sensors. The high quality factor achievable using the ink formulations described in this disclosure provides the opportunity to have substantially higher sensor densities (multiple sensors packed in an area) and therefore improved detection capabilities.

A method of the invention includes use of a printed crack sensor of the invention for wireless (i.e., remote) or wired (i.e., contact) detection of surface damage that includes but is not limited to cracks in the range of over about 1 micron on substrates such as ceramics, plastics, composites, concrete, wood, fabric, leather, rubber or paper. In another embodiment, a method of the invention includes using a printed crack sensor of the invention for wireless or wired detection of surface damage in ceramic body armor, small arms protective insert plates (SAPI), trauma plates, rifle plates, ballistic plates that are used in the improved outer tactical vest well, modular tactical vest or other personal protection equipment.

EXEMPLIFICATION

Example 1

2 grams of silver flakes and 118 milligrams of silver 2,4-pentanedionate were weighed in a mortar and ground with a pestle for an hour. The mixture was transferred into a glass vial and 530 milligrams of α-terpineol solvent was added. All the constituents were mixed well for 5 minutes using a high-speed vortexer to obtain a viscous paste containing 80% solids. The decomposition characteristics of the prepared pastes as well as the commercial samples were analyzed using a thermogravimetric analyzer (TGA Q50, V6.7). Approximately 10 milligrams of the samples were weighed in platinum pans and heated up to 600° C. at a rate of 10° C./min. Line patterns (30 mm×3 mm) were screen-printed on polyester films using a 305-mesh polyester screen. The patterns were subsequently heat-cured in an oven at 140° C. and the resistance across the ends of the lines was measured as a function of time using a digital multimeter. Resonant inductor-interdigital capacitor circuits were screen-printed on ceramic tiles and subsequently heat-cured at 140° C. for 10 minutes. The printed sensors were wirelessly interrogated using an HP8753 vector network analyzer connected with a loop antenna. The reflection parameter, $S_{11}$, was scanned over the frequency range of interest and the position and quality of the resonant peak were monitored. The antenna was also held about 1 centimeter out of the plane of the sensors to determine the RF response.

Example 2

Figure 9A:
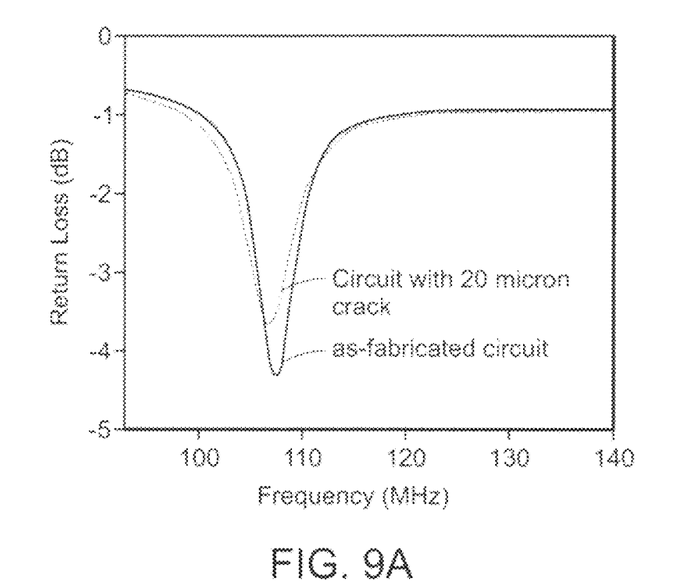
FIG. 9A depicts the resonance response of a sensor fabricated on a ceramic plate and the attenuated resonance response of the sensor after a 20 micron wide crack has been created across the sensor.
Figure 9B:
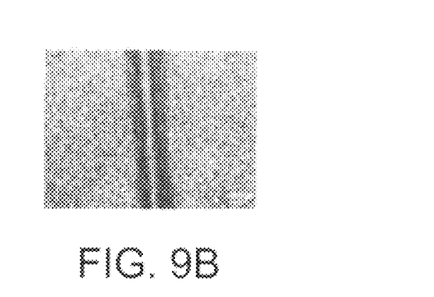
FIG. 9B is an optical photograph of the 20 micron crack created on the sensor.
Figure 10A:
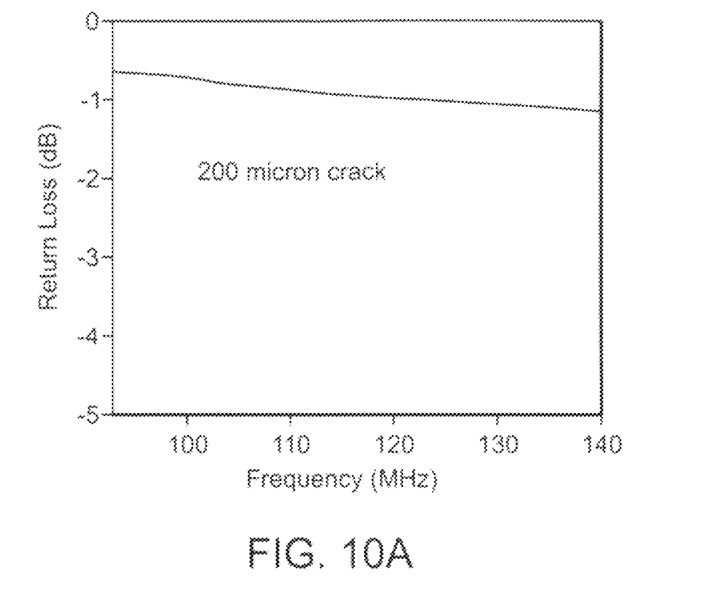
FIG. 10A depicts the complete loss of resonance response of the sensor when a 200 micron wide crack traverses across the sensor. Inset: optical micrograph of the 200 micron crack traversing the sensor.
Figure 10B:
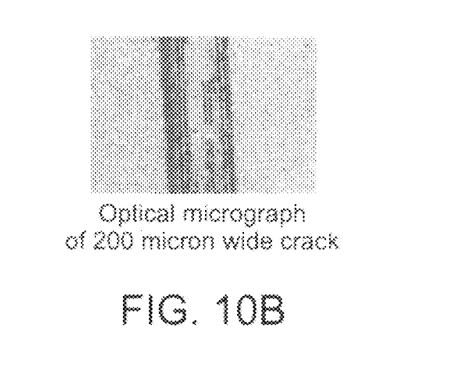
FIG. 10B is an optical micrograph of the 200 micron crack traversing the sensor.

To demonstrate the use of printed sensors based on inks described in this patent, LC sensors were printed on ceramic substrates with polymer fibers of diameter 8 microns, held across the entire width of the ceramic tile. The printed pattern was transformed into conductive metallic elements and LC sensors by curing at 150 C. On interrogation with a loop antenna and network analyzer, the characteristic response (dip at the resonant frequency) was obtained as shown in FIG. 9. After curing, the polymer fiber was pulled normal to the surface of the ceramic thus creating a crack on the LC pattern. FIG. 10 shows the optical micrograph of a ~20 μm crack cutting across the LC sensing elements. The crack does not completely break interparticle contact, but an attenuation of the resonant peak or reduction in the quality factor is observed. A crack of width of about ~200 μm was generated by printing the sensors on multiple fibers tied together and pulling the fibers normal to the surface of the ceramic. The generated crack resulted in a complete loss of the characteristic resonant peak of the LC circuit as shown in FIG. 10. The optical micrograph of a ~200 μm crack is also shown in the FIG. 10.

The ultimate resolution of the crack sensor (width of the crack that can be detected) is less than 20 microns. Surface crack of width ~20 μm lead to attenuation of the resonance response (smaller loss). However, a surface crack of width ~200 μm lead to disruption of the circuit and complete loss of the resonant peak.

EQUIVALENTS

While this invention has been particularly shown and described with references to example embodiments thereof, it will be understood by those skilled in the art that various changes in form and details may be made therein without departing from the scope of the invention encompassed by the appended claims.

What is claimed is:

1. A method for fabricating a printed circuit, comprising the steps of:
   a) combining metal flakes, an organic metal precursor, an organic solvent and a thermally decomposable binder that consists of N, N, N'-trimethyl ethylene diamine carbamate gel or etheylene diamine carbamate gel to form a paste;
   b) depositing the paste in a circuit pattern on a substrate; and
   c) curing the circuit pattern on the substrate, whereby the organic metal precursor decomposes to leave an electrically conductive path, thereby forming the printed circuit.

2. The method of claim 1, wherein the paste is deposited into the substrate by screen printing.

3. The method of claim 1, wherein the metal flakes have a major dimension in a range of less than about 10 micrometers.

4. The method of claim 3, wherein the metal flakes have a major dimension of less than about 5 micrometers.

5. The method of claim 4, wherein the metal flakes are in the form of nanoparticles having a diameter between about 20 and about 500 nanometers.

6. The method of claim 3, wherein the paste includes the metal flakes in an amount in a range of between about 60% and about 90% by weight.

7. The method of claim 6, wherein the paste includes the metal flakes in an amount in a range of between about 75% and about 85% by weight.

8. The method of claim 3, wherein the organic metal precursor is at least one member selected from the group consisting of silver acrylate, silver 2,4 pentanedionate, silver neodecanoate and silver 2-ethylhexanoate.

9. The method of claim 3, wherein the organic solvent is at least one member selected from the group consisting of ethyl lactate, butyl acetate, propylene glycol monomethyl ether acetate, 2-butoxyethyl acetate and 2-butoxyethanol.

10. The method of claim 3, wherein the organic solvent includes at least one member selected from the group consisting of alpha terpineol, butylcarbitol acetate and carbamate.

11. The method of claim 1, wherein the circuit pattern is cured at a temperature less than about 350° C.

12. The method of claim 11, wherein the circuit pattern is cured at a temperatures less than about 250° C.

13. The method of claim 12, wherein the circuit pattern is cured at a temperatures less than about 200° C.

14. The method of claim 13, wherein the circuit pattern is cured at a temperatures less than about 150° C.

15. A method of forming a printed crack sensor, comprising the steps of:
   a) combining metal flakes, an organic metal precursor, an organic solvent and a thermally decomposable binder that consists of N, N, N'-trimethyl ethylene diamine carbamate gel or etheylene diamine carbamate gel to form a paste;
   b) depositing the paste in a circuit pattern consisting of inductors, capacitors or combinations thereof on a substrate; and c) curing the circuit pattern on the substrate, whereby the organic metal precursor decomposes to leave an electrically conductive path, thereby forming the printed crack sensor.

16. The method of claim 15, wherein the substrate is selected from the group consisting of ceramic, plastic, composite, concrete, wood, fabric, leather, rubber and paper.

17. The method of claim 15, wherein the substrate is selected from the group consisting of ceramic body armor, Small Arms Protective Insert (SAPI) plates, trauma plates, rifle plates, ballistic plates that are used in the improved outer tactical vest well, modular tactical vest or other personal protection equipment.

\* \* \* \* \*